(12) United States Patent
Tsai et al.

(10) Patent No.: US 8,629,712 B2
(45) Date of Patent: Jan. 14, 2014

(54) OPERATIONAL AMPLIFIER

(75) Inventors: Hung-Chieh Tsai, Tainan Hsien (TW); Yu-Hsin Lin, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/408,041

(22) Filed: Feb. 29, 2012

(65) Prior Publication Data

US 2012/0161874 A1 Jun. 28, 2012

Related U.S. Application Data

(63) Continuation of application No. 12/051,989, filed on Mar. 20, 2008, now Pat. No. 8,149,047.

(51) Int. Cl.
*G05F 3/02* (2006.01)

(52) U.S. Cl.
USPC ........................................................ 327/539

(58) Field of Classification Search
None
See application file for complete search history.

(56) References Cited

U.S. PATENT DOCUMENTS

| | | | |
|---|---|---|---|
| 4,689,607 A | 8/1987 | Robinson | |
| 5,811,993 A | 9/1998 | Dennard et al. | |
| 5,821,776 A | 10/1998 | McGowan | |
| 6,356,153 B1 | 3/2002 | Ivanov et al. | |
| 6,411,158 B1 | 6/2002 | Essig | |
| 7,030,695 B2 * | 4/2006 | May et al. | 330/253 |
| 7,061,322 B2 | 6/2006 | Heightly | |
| 7,112,998 B2 | 9/2006 | Ajit | |
| 7,116,181 B2 | 10/2006 | Bakker | |
| 7,286,002 B1 * | 10/2007 | Jackson | 327/539 |
| 7,349,190 B1 | 3/2008 | Maheedhar et al. | |
| 7,489,193 B2 | 2/2009 | Adachi | |
| 7,514,987 B2 | 4/2009 | Lin | |
| 2002/0008562 A1 | 1/2002 | Kokubun et al. | |
| 2002/0036489 A1 | 3/2002 | Cocetta | |
| 2002/0067210 A1 * | 6/2002 | Donig | 330/298 |
| 2003/0058031 A1 | 3/2003 | Scoones | |
| 2005/0001682 A1 * | 1/2005 | May et al. | 330/253 |
| 2005/0040803 A1 | 2/2005 | Ueda | |
| 2007/0035335 A1 * | 2/2007 | Lee | 327/94 |
| 2007/0109037 A1 | 5/2007 | Lin | |
| 2008/0169866 A1 | 7/2008 | Kleveland et al. | |
| 2009/0085549 A1 | 4/2009 | Sengupta et al. | |

FOREIGN PATENT DOCUMENTS

| | | |
|---|---|---|
| CN | 1713520 | 12/2005 |
| JP | 2007311448 | 11/2007 |
| TW | 200720878 | 11/1995 |

OTHER PUBLICATIONS

English Abstract translation of JP2007311448 (Published Nov. 29, 2007).

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

An operational amplifier comprises: a plurality of transistors, comprising: a first transistor; and a second transistor, wherein a source of the first transistor is connected to a source of the second transistor; wherein the first transistor and the second transistor have near zero threshold voltage.

12 Claims, 8 Drawing Sheets

OPERATIONAL AMPLIFIER

CROSS REFERENCE TO RELATED APPLICATIONS

This application is a Continuation of application Ser. No. 12/051,989, filed Mar. 20, 2008, the entirety of which is incorporated by reference herein.

BACKGROUND OF THE INVENTION

1. Field of the Invention

The invention relates to an operational amplifier, and more particularly to an operational amplifier with low operating voltage.

2. Description of the Related Art

Reference voltage is typically required to provide a substantially constant output voltage despite gradual or momentary changes in input voltage, output current or temperature. In particular, many designers have utilized bandgap reference circuits due to their ability to provide a stable voltage supply that is insensitive to temperature variations over a wide temperature range. These bandgap references rely on certain temperature-dependent characteristics of the base-emitter voltage of a transistor. Bandgap reference circuits typically operate on the principle of compensating the negative temperature coefficient of a base-emitter voltage of a bipolar transistor with the positive temperature coefficient of the thermal voltage. In general cases, the temperature-independent voltage is around 1.25V, and if the system cannot provide sufficient voltage, the bandgap reference circuit may cause errors or fail to operate, i.e. based on the present architecture of bandgap reference circuits, the bandgap reference circuit cannot operate at a voltage 1.2V or lower.

BRIEF SUMMARY OF THE INVENTION

The invention provides an operational amplifier, comprises: a plurality of transistors; a first gate of a first transistor, receiving a first voltage signal; and a second gate of a second transistor, receiving a second voltage signal, and a first source of the first transistor is connected to a second source of the second transistor; wherein the first transistor and the second transistor have near zero threshold voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
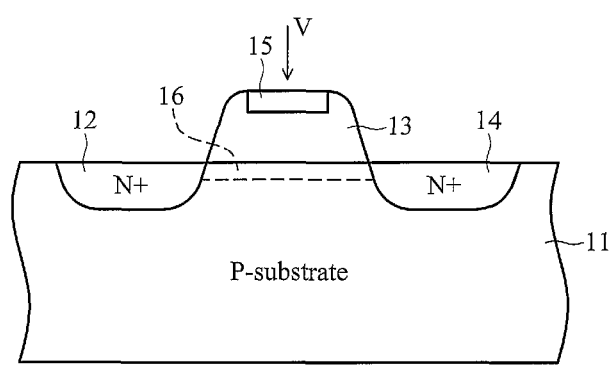
FIG. 1 is a cross section diagram of a native NMOS transistor.

FIG. 1 is a cross section diagram of a native NMOS transistor. A gate structure 13 formed on the P-substrate 11 and a conductive metal area 15 is disposed on the gate structure 13 for receiving a bias voltage V. Two N-type doped regions 12 and 14 are formed in P-substrate 11 to form the source and drain of the native NMOS transistor. When the bias voltage V is applied on the gate structure 13, a channel 16 formed beneath the gate structure 13. In the native NMOS transistor shown in FIG. 1, the amount of the bias voltage V is extremely small, and can even be brought to zero, by adequate semiconductor process.

Figure 2:
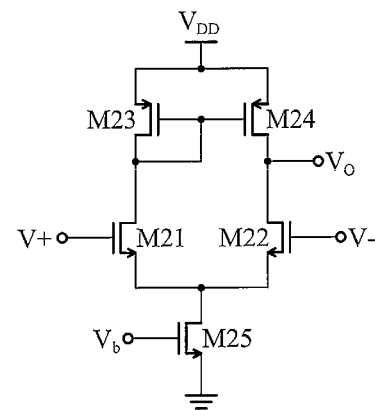
FIG. 2 is a circuit diagram of an embodiment of a PMOS-input-based operational amplifier.

FIG. 2 is a circuit diagram of an embodiment of a PMOS-input-based operational amplifier. NMOS transistor M23 has a source coupled to a high voltage source VDD, a drain and a gate coupled to the drain. NMOS transistor M24 has a source coupled to the high voltage source VDD, a gate couple to the gate of the NMOS transistor M23, and a drain. PMOS transistor M21 has a gate receiving a first input voltage V+, a drain coupled to the drain of the NMOS transistor M23, and a source. PMOS transistor M22 has a gate receiving a second input voltage V−, a drain coupled to the drain of the NMOS transistor M24, and a source coupled to the source of the PMOS transistor M21. PMOS transistor M25 has a gate receiving a bias voltage Vb, a drain coupled to the source of the PMOS transistor M21, and a source grounded. In this embodiment, the threshold voltages of the PMOS transistors M21 and M22 are zero, however, positive or negative threshold voltages near zero also apply. The term "near zero threshold voltage" herein may be, for example, a threshold voltage between −0.2V~+0.2V. In order to prevent the PMOS transistor M25 from entering the linear region, the saturation voltage of PMOS transistor M25 satisfies the equation:

$$Vds_{M25} > Vgs_{m25} - Vt_{M25}$$

$$\Rightarrow Vd_{M25} > Vg_{M25} - Vt_{M25}$$

Furthermore, in order to ensure that the PMOS transistor M21 is activated, the input voltage V+ satisfies the equation:

$$V+ > Vd_{M25} + Vt_{M21}$$

Since the threshold voltage of the PMOS transistor M21 is zero, thus, when the input voltage V+ is larger than $Vd_{M25}$, the PMOS transistor M21 is activated.

In order to ensure that the PMOS transistor M21 is at the saturation region, the saturation voltage of PMOS transistor M21 satisfies the equation:

$$Vd_{M21} > V+$$

Since the $Vd_{m21}$ is equal to $Vg_{M23}$, we can rewrite the equation as the following:

$$Vg_{M23} > V+$$

The high voltage source VDD provides the operating voltage to the operational amplifier shown in FIG. 2, and satisfies the equation:

$$VDD > Vg_{M23} + Vt_{M23}$$

In brief, the operating voltage of the operational amplifier shown in FIG. 2 can be reduced due to the zero threshold voltage of PMOS transistors M21 and M22.

Figure 3:
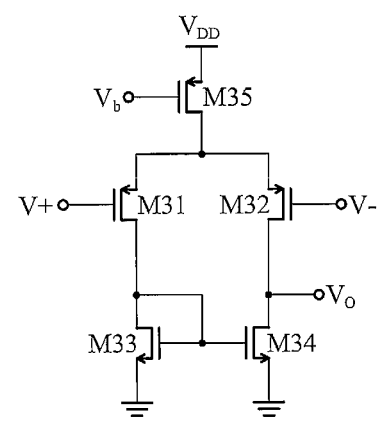
FIG. 3 is a circuit diagram of an embodiment of an NMOS-input-based operational amplifier.

FIG. 3 is a circuit diagram of an embodiment of an NMOS-input-based operational amplifier. NMOS transistor M35 has a source coupled to a high voltage source VDD, a gate receiving a bias voltage Vb, and a drain. NMOS transistor M31 has a source coupled to the drain of the NMOS transistor M35, a gate receiving a first input voltage, and a drain. NMOS transistor M32 has a source coupled to the drain of the NMOS transistor M35, a gate receiving a second input voltage, and a drain coupled to the output voltage V0. PMOS transistor M33 has a source grounded, a gate, and a drain, wherein the gate and the drain are coupled to the drain of the NMOS transistor M31. PMOS transistor M34 has a source grounded, a gate coupled to the gate of the PMOS transistor M33, and a drain coupled to the drain of the NMOS transistor M32. In this embodiment, the threshold voltages of the NMOS transistors M31 and M32 may be zero, and the operating voltage of the operational amplifier shown in FIG. 3 can be reduced due to the zero threshold voltage of NMOS transistors M31 and M32. The related description and derivation can be referred in the statement of FIG. 2.

Figure 4:
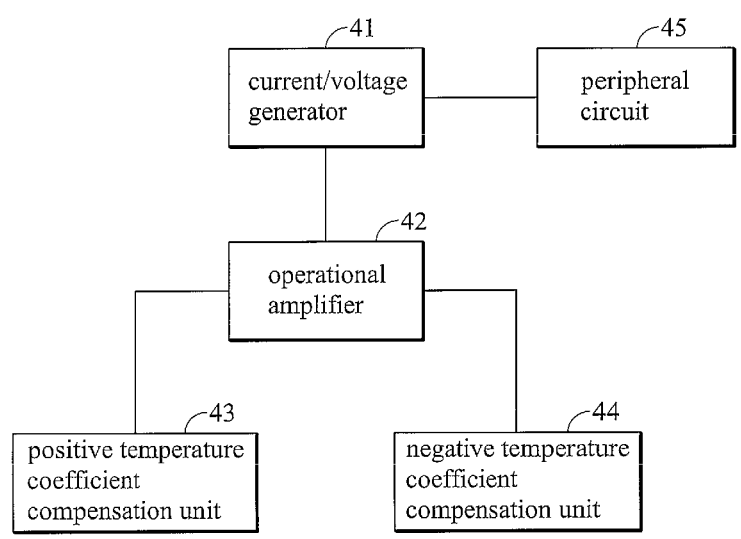
FIG. 4 is a block diagram of an embodiment of a temperature-independent system.

FIG. 4 is a block diagram of an embodiment of a temperature-independent system. The operational amplifier 42 has two input terminal receiving input voltages from the positive temperature coefficient compensation unit 43 and the negative temperature coefficient compensation unit 44. The voltage from the positive temperature coefficient compensation unit 43 carries a positive temperature coefficient and the voltage from the negative temperature coefficient compensation unit 44 carries a negative temperature coefficient. The operational amplifier 42 utilizes an external circuit to eliminate the temperature coefficient based on the ratio of positive temperature coefficient to the negative temperature. In this embodiment, the transistors in the operational amplifier 42 for receiving input voltages have zero or near zero threshold voltages. The operational amplifier 42 outputs a temperature-independent voltage to the current/voltage generator 41. The current/voltage generator 41 generates at least one desired voltage/current to the peripheral circuit 45.

Figure 5:
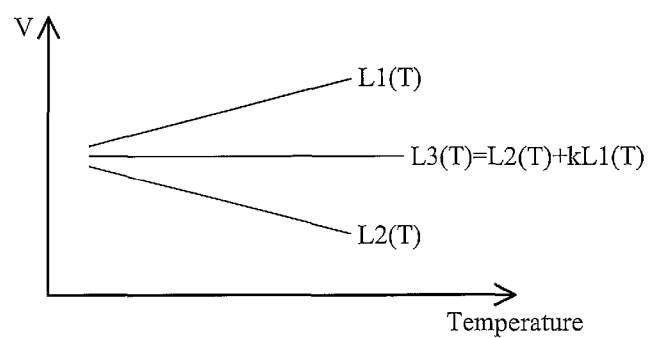
FIG. 5 shows a method for obtaining a temperature-independent voltage.

FIG. 5 shows a method for obtaining a temperature-independent voltage. L1(T) provides a voltage with a positive temperature coefficient, L2(T) provides a voltage with a negative temperature coefficient, and L3(T) is a combination of L1(T) and L2(T) for providing a temperature-independent voltage. L3(T) can be expressed as: L3(T)=L2(T)+kL1(T). We can adjust the value of k to eliminate the temperature coefficient, where k is based on the ratio of positive temperature coefficient to the negative temperature.

The base-emitter voltage of a bipolar transistor exhibits a negative temperature coefficient (TC). For a bipolar transistor, we can write $Ic=Is*exp^{V_{BE}/V_T}$, where $V_T=kT/q$. The saturation current Is is proportional to $\mu k T n_i^2$, wherein $\mu$ is the mobility of minority carriers and $n_i$ is the intrinsic minority carrier concentration of silicon. The parameter $\mu$ depends on the temperature, and the quantity is represented as $\mu \propto \mu_0 T^m$, wherein $m \approx 3/2$. The parameter $n_i$ also depends on the temperature, and the quantity is represented as $n_i^2 \propto T^3 e^{-Eg/kT}$ where $E_g \approx 1.12$ eV is the bandgap energy of silicon. Thus, we can rewrite the saturation current Is as the following:

$$Is = bT^{4+m}e^{-Eg/kT} \quad (1)$$

where b is a proportionality factor. Writing $V_{BE}=V_T \ln(I_c/I_s)$, we can compute the temperature coefficient of base-emitter voltage. Taking the derivative of $V_{BE}$ with respect to T, we can obtain the equation:

$$\frac{\partial V_{BE}}{\partial T} = \frac{\partial V_T}{\partial T}\ln\frac{I_C}{I_s} - \frac{V_T}{I_s}\frac{\partial Is}{\partial T} \quad (2)$$

From (1), we obtain $$\frac{V_T}{I_s}\frac{\partial Is}{\partial T} = (4+m)\frac{V_T}{T} + \frac{Eg}{kT^2}V_T \quad (3)$$

With (1) and (3), we can write $$\frac{\partial V_{BE}}{\partial T} = \frac{V_{BE} - (4+m)V_T - Eg/q}{T} \quad (4)$$

Equation (4) provides the temperature coefficient of the base-emitter voltage at a given temperature. With $V_{BE}$=750 mV and $$T = 300° \text{ K}, \frac{\partial V_{BE}}{\partial T} = -1.5 \text{ mV}/° \text{ K}.$$

Figure 6:
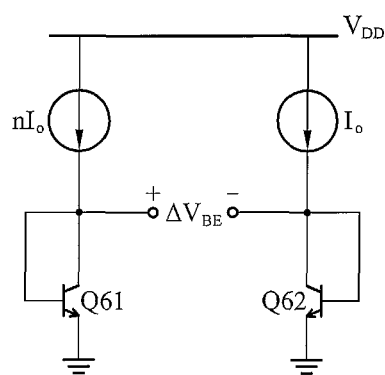
FIG. 6 is a circuit diagram of an embodiment of a proportional-to-absolute-temperature voltage generator.

To explain the positive temperature coefficient, please refer to FIG. 6. FIG. 6 is a circuit diagram of an embodiment of a proportional-to-absolute-temperature (PTAT) voltage generator. In FIG. 6, two identical transistors Q61 and Q62 ($Is_{Q61}=Is_{Q62}$) are biased at collector current of nIo and Io and their base current are negligible, then $$\Delta V_{BE} = V_{BE1} - V_{BE2}$$
$$= V_T \ln\frac{nIo}{I_{S1}} - V_T \ln\frac{Io}{I_{S2}}$$
$$= VT \ln n$$

Thus, the $V_{BE}$ difference exhibits a positive temperature coefficient:

$$\frac{\partial \Delta V_{BE}}{\partial T} = \frac{k}{q}\ln n$$

Voltages with negative and positive TCs are described, and if we want to obtain a temperature-independent voltage, we can use one voltage with positive TC and one voltage with negative TC and eliminate the temperature coefficient, as is shown in FIG. 5.

Figure 7:
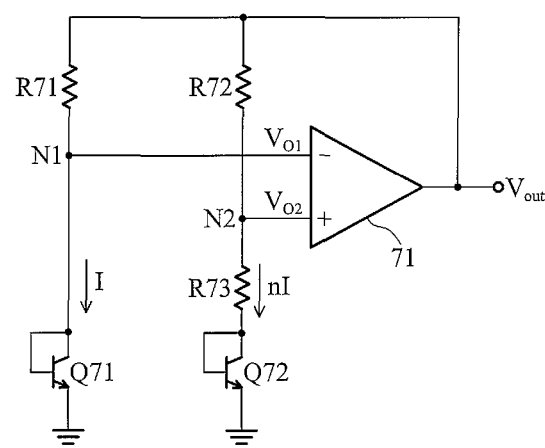
FIG. 7 is a circuit diagram of an embodiment of a bandgap reference circuit.

With the negative- and positive-TC voltages obtained above, we can develop a reference voltage having a zero temperature coefficient. We can write Vref=$\alpha_1 V_{BE}+\alpha_2(V_T \ln n)$, where $V_T \ln n$ is the difference between the base-emitter voltages of bipolar transistors Q71 and Q72. FIG. 7 is a circuit diagram of an embodiment of a bandgap reference circuit. Amplifier 71 receives voltages $V_{o1}$ and $V_{o2}$, and the MOS transistors in amplifier 71 for receiving voltages $V_{o1}$ and $V_{o2}$ may have zero or near zero threshold voltage. Preferably, the amplifier 71 may be implemented as the ones shown in FIG. 2 and FIG. 3. In order to obtain approximate voltage at nodes N1 and N2, resistors R71 and R72 have the same resistance. In FIG. 7, the output voltage Vout can be expressed as:

$$V_{out} = V_{BEQ72} + \frac{V_T \ln n}{R73}(R73 + R72)$$
$$= V_{BEQ72} + (V_T \ln n)\left(1 + \frac{R72}{R73}\right)$$

At room temperature, $$\frac{\partial V_{BE}}{\partial T} = -1.5 \text{ mV}/°\text{K},$$

and $$\frac{\partial V_T}{\partial T} = 0.087 \text{ mV}/°\text{K},$$

in order to eliminate the temperature coefficient effect for the voltage, the value of $$\ln n\left(1 + \frac{R72}{R73}\right)$$

is approximate to 17.2, the ratio of $$\frac{\partial V_{BE}}{\partial T} \text{ to } \frac{\partial V_T}{\partial T}.$$

Figure 8:
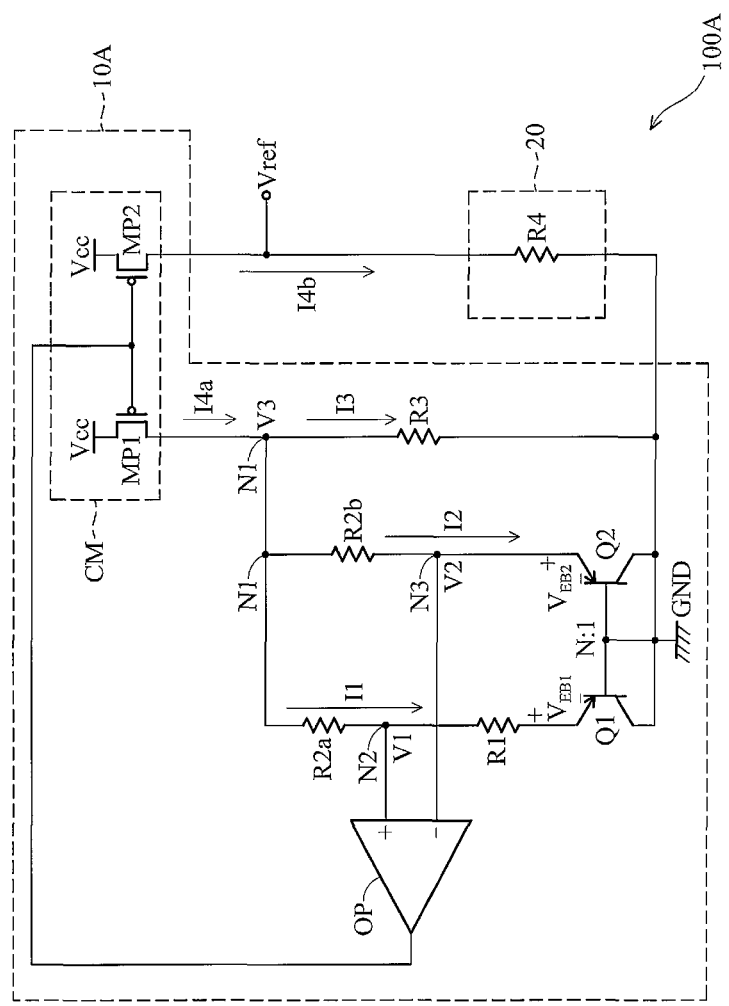
FIG. 8 is a circuit diagram of another embodiment of a bandgap reference circuit.

FIG. 8 shows an embodiment of a bandgap reference circuit. As shown, a bandgap reference circuit 100A comprises a current generation circuit 10A and a current-to-voltage generator 20. The current generation circuit 10A generates two identical output currents I4a and I4b, and the current I4b is obtained by combining currents I1, I2 and I3 since the currents I4a and I4b are identical. The current-to-voltage generator 20 generates an output voltage Vref according to the current I4b generated by the current generation circuit 10A.

The current generation circuit 10A comprises a current mirror CM, an operational amplifier OP, resistors R1, R2a, R2b and R3, and two bipolar transistors Q1 and Q2, in which the current mirror CM comprises two PMOS transistors MP1 and MP2 and the resistors R2a and R2b have the same resistance. In this embodiment, the transistors in the operational amplifier OP for receiving input voltages may have zero or near zero threshold voltage. For example, the transistors MP1 and MP2 have the same size, and the emitter area of the transistor Q1 can be N times that of the transistor Q2, in which N>1. The current-to-voltage generator 20 can be a resistor, a resistive element, a passive element or combinations thereof. In this case, the current-to-voltage generator 20 comprises a resistor R4.

The transistor MP1 comprises a first terminal coupled to a power voltage Vcc, a second terminal coupled to a node N1, and a control terminal coupled to the transistor MP2. The transistor MP2 comprises a first terminal coupled to the power voltage Vcc, a control terminal coupled to the control terminal of the transistor MP1 and a second terminal coupled to the resistor R4. The resistor R3 is coupled between the node N1 and a ground voltage GND, the resistor R2a is coupled between the nodes N1 and N2, the resistor R2b is coupled between the nodes N1 and N3, and the resistor R1 is coupled between the node N2 and the transistor Q1.

The operational amplifier comprises a first terminal coupled to the node N2 and a second terminal coupled to the node N3, and an output terminal coupled to the control terminals of the transistors MP1 and MP2 in the current mirror CM. The operational amplifier OP outputs a control signal to control the current mirror CM according to the voltages at the nodes N2 and N3.

The transistor Q1 comprises an emitter coupled to the resistor R1 and a collector coupled to the ground voltage GND and a base coupled to the transistor Q2. The transistor Q2 comprises an emitter coupled to the node N3 and a collector coupled to the ground voltage GND and a base coupled to the base of the transistor Q1. In this case, the bases of the transistor Q1 and Q2 are coupled to the ground voltage GND. Namely, the transistors Q1 and Q2 are diode-connected transistors.

If the base current is neglected, the emitter-base voltage $V_{EB}$ of a forward active operation diode can be expressed as:

$$V_{EB} = \frac{kT}{q}\ln\left(\frac{Ic}{Is}\right)$$

Wherein k is the Boltzmann's constant ($1.38 \times 10^{-23}$ J/K), q is the electronic charge ($1.6 \times 10^{-29}$ C), T is temperature, $I_C$ is the collector current, and $I_s$ is the saturation current.

When the input voltages V1 and V2 of the operational amplifier OP are matched and the size of the transistor Q1 is N times that of the transistor Q2, the emitter-base voltage difference between the transistors Q1 and Q2, $\Delta V_{EB}$, becomes:

$$\Delta V_{EB} = V_{EB2} - V_{EB1} = \frac{kT}{q}\ln N$$

Wherein $V_{EB1}$ is the emitter-base voltage of the transistor Q1, and $V_{EB2}$ is the emitter-base of the transistor Q2.

Because the input voltages V1 and V2 are matched by the operational amplifier OP, the voltages V1 and V2 can be expressed as:

$$V1 = V2 = V_{EB2} = V_{EB1} + I1 \times R1$$
$$I1 \times R1 = V_{EB2} - V_{EB1} = \frac{kT}{q}\ln N$$

Thus, the current I1 through the resistors R2a and R1 can be expressed as:

$$I1 = \frac{V_T}{R1}\ln N,$$

wherein thermal voltage is $$V_T = \frac{kT}{q}.$$

Because the resistors R2a and R2b are identical and the input voltages V1 and V2 are matched by the operational amplifier OP, the current I2 can be the same as the current I1.

Accordingly, $$I1 = I2 = \frac{V_T}{R1}\ln N,$$

since the thermal voltage $V_T$ has a positive temperature coefficient of 0.085 mV/° C., and the currents I1 and I2 have positive temperature coefficient.

Thus, voltage V3 at the node N1 can be expressed as:

$$V3 = I3 \times R3 = I1 \times (R1+R2a) + V_{EB1} = I2 \times R2b + V_{EB2}$$

Hence, the current I3 can be expressed as:

$$I3 = \frac{1}{R3}\left[V_{EB2} + \left(\frac{V_T \ln N}{R1} \times R2b\right)\right]$$

Because the emitter-base voltage $V_{EB}$ of the transistors has a negative temperature coefficient of −2 mV/° C., the current I3 has a negative temperature coefficient.

As the transistors MP1 and MP2 in the current mirror CM are identical, the current I4b is the same as the current I4a, and can be expressed as:

$$I4a = I4b = I1 + I2 + I3 = 2I1 + I3 = \left(\frac{2}{R1} + \frac{R2b}{R1 \times R3}\right) \times V_T \ln N + \frac{V_{EB2}}{R3}$$

Hence, if a proper ratio of resistances of the resistors R1, R2a, R2b and R3 is selected, the current I4a will have a near zero temperature coefficient and low sensitivity to temperature. Namely, each current mirror output (currents I4a and I4b) of the current mirror CM will have a near zero temperature coefficient and low sensitivity to temperature.

Accordingly, the output voltage of the bandgap reference circuit 100A can be expressed as:

$$V_{ref} = I4b \times R4$$
$$= \left(\frac{2R4}{R1} + \frac{R2b \times R4}{R1 \times R3}\right) \times V_T \ln N + \frac{R4}{R3} \times V_{EB2}$$

Note that the resistors R2a and R2b prevent direct connection of the input terminal of the operational amplifier OP, ensuring normal operation of amplifier OP. Without the resistor R3, the output voltage Vref of the bandgap reference circuit is limited to 1.25V, which cannot be operated in low voltage environments, in order to obtain a near zero temperature coefficient. Thus, the invention utilizes the resistor R3 to induce the current I3 with negative temperature coefficient to overcome such limitation, and if a proper ratio of resistances of the resistors R1, R2a, R2b, R3 and R4 is selected, the output voltage Vref will have low sensitivity to temperature and can be operated in low voltage environments.

Figure 9:
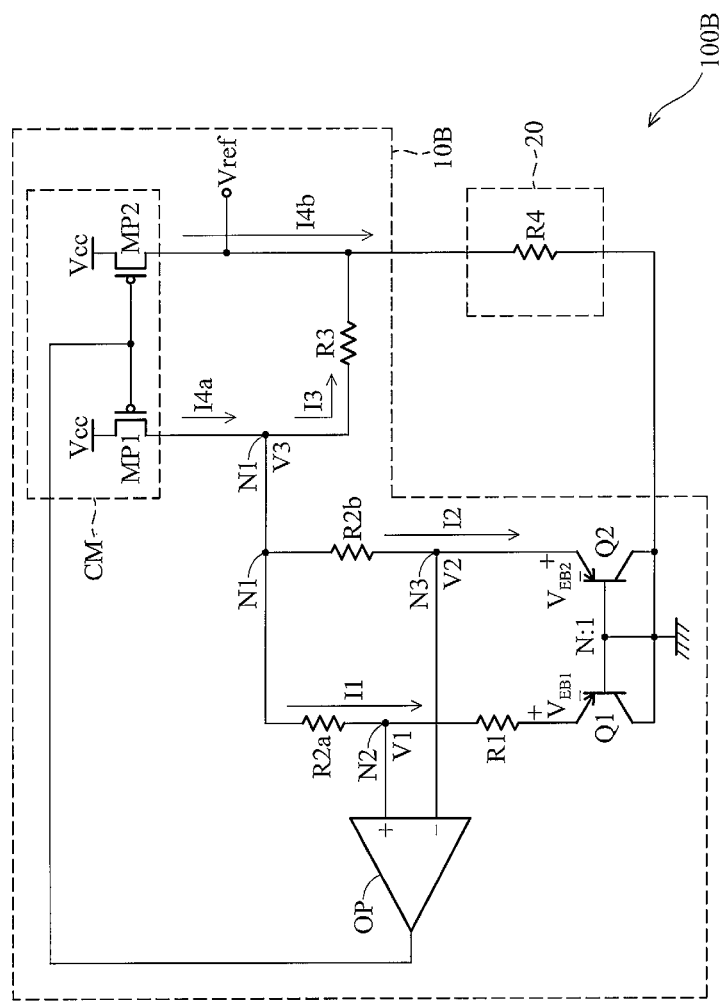
FIG. 9 is a circuit diagram of another embodiment of a bandgap reference circuit.

FIG. 9 shows another embodiment of a bandgap reference circuit. As shown, the bandgap reference circuit 100B is similar to the bandgap reference circuit 100A shown in FIG. 1 except for the resistor R3. The resistor R3 is coupled between the node N1 and the resistor R4 rather than the ground voltage GND. In this embodiment, the transistors in the operational amplifier OP for receiving input voltages may have zero or near zero threshold voltage.

Similarly, currents I1 and I2 are equal and can be expressed as:

$$I1 = I2 = \frac{V_T}{R1}\ln N$$

The voltage V3 at the node N1 and the output voltage Vref can be expressed as:

$$V3 = \frac{V_T \ln N}{R1} \times R2b + V_{EB2}$$

$$V_{ref} = R4 \times \left[\left(\frac{V3 - V_{ref}}{R3}\right) + 2I2 + \left(\frac{V3 - V_{ref}}{R3}\right)\right]$$
$$= R4 \times \left(\frac{2V3}{R3} - \frac{2V_{ref}}{R3} + 2I2\right)$$
$$= \frac{1}{\left(1 + \frac{2R4}{R3}\right)}\left[\frac{R4}{R3}V_{EB2} + \left(\frac{2R2 \times R4}{R1 \times R3} + \frac{2R4}{R1}\right)V_T \ln N\right]$$

Because the emitter-base voltage $V_{EB}$ of transistors has a negative temperature coefficient of −2 mV/° C., the current I3 has a negative temperature coefficient. Hence, if a proper ratio of resistances of the resistors R1, R2a, R2b, R3 and R4 is selected, the output voltage Vref will have low sensitivity to temperature and can be operated in low voltage environments. Similarly, if a proper ratio of resistances of the resistors R1, R2a, R2b, R3 and R4 is selected, the output voltage Vref will have low sensitivity to temperature, the currents I4a and I4b can also have low sensitivity to temperature, and the description thereof is omitted for simplification.

The bandgap reference circuits 100A and 100B of the invention can act as a necessary functional block for the operation of mixed-mode and analog integrated circuits (ICs), such as data converters, phase lock-loop (PLL) circuits, oscillators, power management circuits, dynamic random access memory (DRAM), flash memory, and much more. For example, the bandgap reference circuit 100A may provide the current I4b or the output voltage Vref to a core circuit and the core circuit executes functions thereof accordingly.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An operational amplifier, comprising: a plurality of transistors, comprising:
   a first transistor;
   a second transistor, wherein a source of the first transistor is connected to a source of the second transistor; and
   a third transistor, having its gate directly connected to a drain of the first transistor and its drain directly connected to a drain of the second transistor,
   wherein the first transistor and the second transistor have near zero threshold voltage, and an operation voltage of the operational amplifier is below 1.2V.

2. The operational amplifier as claimed in claim 1, wherein a gate of the third transistor is connected to a gate of a fourth transistor.

3. The operational amplifier as claimed in claim 2, wherein the third transistor and the fourth transistor have near zero threshold voltage.

4. The operational amplifier as claimed in claim 1, wherein at least one of the transistors has a source directly grounded or directly coupled to a high voltage source.

5. The operational amplifier as claimed in claim 1, further comprises a fifth transistor, having its drain connected to the source of the first transistor and the source of the second transistor, and its gate receiving a bias voltage.

6. The operational amplifier as claimed in claim 1, wherein a gate of the first transistor is a first input terminal of the operational amplifier and a gate of the second transistor is a second input terminal of the operational amplifier.

7. The operational amplifier as claimed in claim 1, wherein a gate of the first transistor receives a first voltage signal and a gate of the second transistor receives a second voltage signal.

8. The operational amplifier as claimed in claim 7, wherein the first voltage signal and the second voltage signal form a pair of differential signal.

9. The operational amplifier as claimed in claim 1, wherein the first transistor and the second transistor comprises: a n-type substrate; a gate structure formed on the n-type substrate; a first p-type region directly doped in the n-type substrate; and a second p-type region directly doped in the n-type substrate, wherein the first p-type region and the second p-type region are symmetrical with respect to the gate structure.

10. The operational amplifier as claimed in claim 1, wherein the first transistor and the second transistor comprises: a p-type substrate; a gate structure formed on the p-type substrate; a first n-type region directly doped in the p-type substrate; and a second n-type region directly doped in the p-type substrate, wherein the first n-type region and the second n-type region are symmetrical with respect to the gate structure.

11. The operational amplifier as claimed in claim 1, wherein the near zero threshold voltage is a threshold voltage between −0.2V to +0.2V.

12. The operational amplifier as claimed in claim 1, wherein the operational amplifier is a portion of a bandgap reference circuit.

* * * * *